United States Patent [19]
Mase et al.

[11] Patent Number: 5,642,213
[45] Date of Patent: Jun. 24, 1997

[54] ELECTRO-OPTICAL DEVICE

[75] Inventors: Akira Mase, Aichi; Masaaki Hiroki, Kanagawa, both of Japan

[73] Assignee: Semiconductor Energy Laboratory Co., Ltd., Kanagawa, Japan

[21] Appl. No.: 247,924

[22] Filed: May 20, 1994

Related U.S. Application Data

[60] Continuation of Ser. No. 13,240, Feb. 3, 1993, abandoned, which is a division of Ser. No. 846,860, Mar. 6, 1992, abandoned.

[30]    Foreign Application Priority Data

Mar. 15, 1991  [JP]  Japan .................................. 3-076785

[51] Int. Cl.⁶ ............................................. G02F 1/1343
[52] U.S. Cl. ........................ 349/43; 257/659; 349/41
[58] Field of Search ............................ 359/54, 58, 59, 359/57, 87; 340/784; 257/59, 66, 72, 353, 351; 148/DIG. 141; 437/170, 101, 983, 41, 43, 42; 205/124, 125, 78

[56]              References Cited

U.S. PATENT DOCUMENTS

| | | | |
|---|---|---|---|
| 3,806,778 | 4/1974 | Shimahura et al. | 257/406 |
| 4,045,302 | 8/1977 | Gibbs et al. | 205/124 |
| 4,466,172 | 8/1984 | Baton | 437/42 |
| 4,582,395 | 4/1986 | Morozumi | 359/59 |
| 4,646,246 | 2/1987 | Sasaki | 148/141 |
| 4,770,498 | 9/1988 | Aoki et al. | 359/59 |
| 4,789,223 | 12/1988 | Kasahara et al. | 359/57 |
| 4,818,077 | 4/1989 | Ohwada et al. | 359/59 X |
| 4,851,827 | 7/1989 | Nicholas | 340/784 |
| 4,938,565 | 7/1990 | Ichikawa | 359/59 |
| 4,948,231 | 8/1990 | Aoki et al. | 359/59 |
| 5,054,887 | 10/1991 | Kato et al. | 359/59 |
| 5,056,895 | 10/1991 | Kahn | 359/87 |
| 5,066,110 | 11/1991 | Mizushima et al. | 359/79 |
| 5,075,674 | 12/1991 | Katayama et al. | 359/59 |
| 5,126,283 | 6/1992 | Pintchovski et al. | 437/983 |
| 5,134,451 | 7/1992 | Katoh | 257/384 |
| 5,159,476 | 10/1992 | Hayashi | 359/54 |
| 5,187,602 | 2/1993 | Ikeda et al. | 359/79 |
| 5,240,868 | 8/1993 | Yamazaki et al. | 437/194 |
| 5,250,931 | 10/1993 | Misawa et al. | 359/59 |
| 5,289,030 | 2/1994 | Yamazaki et al. | 257/410 |
| 5,383,041 | 1/1995 | Yamazaki et al. | 359/59 |

FOREIGN PATENT DOCUMENTS

| | | | |
|---|---|---|---|
| 0144297 | 12/1978 | Japan | 359/59 |
| 0050028 | 2/1989 | Japan | 359/59 |
| 0130133 | 5/1989 | Japan | 359/59 |

OTHER PUBLICATIONS

"A Laser Recrystallization Technique for Silicon TFT Integrated Circuits on Quart Substrates and Its Application to Small Sized Monolithic Active Matrix LCD's", Fuji et al, IEEE 1990, IEEE Transactions on Electronic Devices, vol. 37, No. 1.

Primary Examiner—William L. Sikes
Assistant Examiner—James A. Dudek
Attorney, Agent, or Firm—Sixbey, Friedman, Leedom & Ferguson, P.C.; Gerald J. Ferguson, Jr.

[57]                    ABSTRACT

A liquid-crystal electro-optical device capable of compensating for the operation of any malfunctioning one of TFTs (thin-film transistors) existing within the device if such a malfunction occurs. Plural complementary TFT configurations are provided per pixel electrode. Each complementary TFT configuration consists of at least one p-channel TFT and at least one n-channel TFT. The input and output terminals of the plural complementary TFT configurations are connected in series. One of the input and output terminals is connected to the pixel electrode, while the other is connected to a first signal line. All the gate electrodes of the p-channel and n-channel TFTs included in said plural complementary TFT configurations are connected to a second signal line.

18 Claims, 8 Drawing Sheets

FIG. 4(A)
FIG. 4(C)
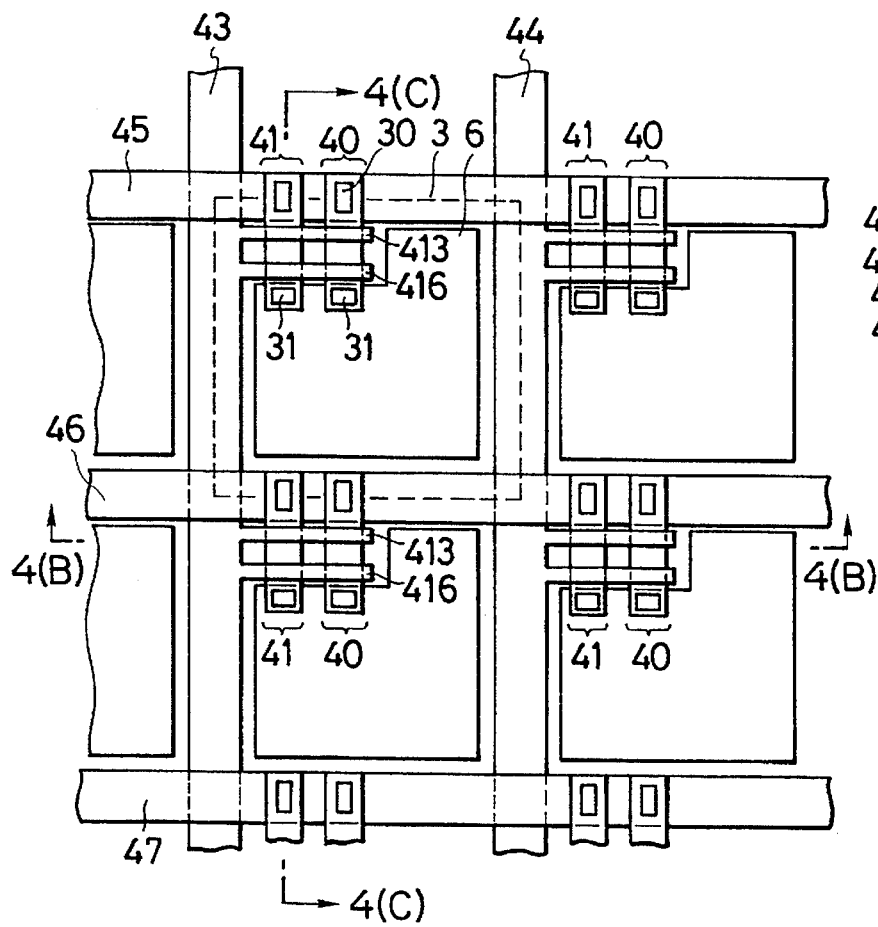
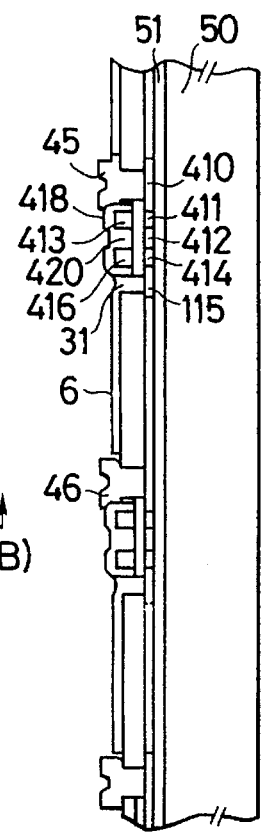
FIG. 4(B)
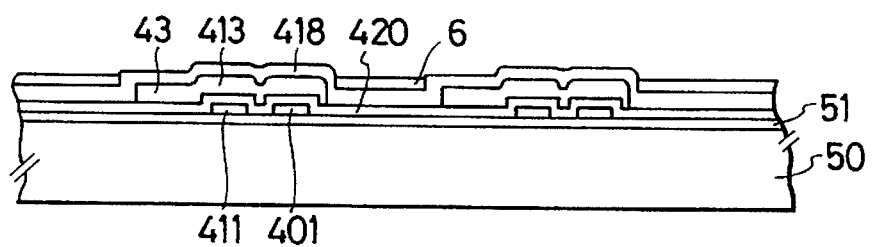

ELECTRO-OPTICAL DEVICE

This application is a Continuation of Ser. No 08/013,240, now abandoned, filed Feb. 3, 1993, which itself was a divisional of Ser. No. 07/846,860, filed Mar. 6, 1992, now abandoned.

FIELD OF THE INVENTION

The present invention relates to an electro-optical device in which thin-film transistors (TFTs) are used as driving switching devices.

BACKGROUND OF THE INVENTION

Active-matrix liquid-crystal electro-optical devices using TFTs are known. These TFTs are made of an amorphous or polycrystalline semiconductor. A TFT of either P-channel or N-channel type is used for each one pixel. Generally, an n-channel TFT is connected with each pixel. A typical example of this configuration is shown in FIG. 2.

FIG. 2 is a schematic equivalent circuit of a conventional liquid-crystal electro-optical device of the above-described kind. The liquid-crystal portion of one pixel is indicated by 22. An n-channel TFT 21 is connected in series with this portion. Pixels of this structure are arranged in rows and columns. Generally, a very large number of pixels such as 640×480 or 1280×960 pixels are arranged. In this figure, only a matrix of 2×2 pixels is shown for simplicity. Signals are applied from peripheral circuits 26 and 27 to the pixels to selectively turn on and off the pixels. If the switching characteristics of the TFTs are good, it is generally possible to obtain a high contrast from this liquid-crystal electro-optical device by time-sharing techniques even at high duty factors.

However, in such a liquid-crystal electro-optical device fabricated in practice, the output signal from each TFT, i.e. the input voltage VLC 20 (hereinafter referred to as the liquid-crystal potential) to the liquid crystal, often fails to take. "1" when it should take "1" (High). Conversely, the voltage sometimes fails to take "0" when it should take "0" (Low). This phenomenon occurs because the TFT acting as a switching device applying a signal to the pixel assumes asymmetric states when it is turned on and off.

The liquid crystal 22 is intrinsically insulative in operation. When the TFT is OFF, the liquid-crystal potential VLC is in a floating condition. This liquid crystal 22 is a capacitor in terms of an equivalent circuit. The potential VLC is determined by the electric charge stored in this capacitor. This charge leaks when the resistance RLC 24 of the liquid crystal is small or when dust or ionic impurities are present in the liquid crystal. If a resistance RGS 25 is produced between the gate electrode and the input or output terminal of the TFT 21 because of pinholes unintentionally occurred in the gate-insulating film of the TFT 21, then the charge leaks from this location. As a result, the potential VLC 20 takes a halfway value.

In a liquid-crystal display comprising a panel having 200 thousand to 500 million pixels, as many TFTs exist. Therefore, the above-described problem takes place. This makes it impossible to accomplish a high production yield. Generally, the liquid crystal 22 consists of a twisted-nematic liquid crystal. To orient the liquid crystal, a rubbed orientation film is formed on each electrode. Static electricity is produced by the rubbing and induces a weak dielectric breakdown in the TFT. As a result, a leakage between the TFT and an adjacent pixel or conductive interconnect occurs, or the gate-insulating film is weak enough to permit leakage. It is quite important for the active-matrix liquid-crystal electro-optical device that the liquid-crystal potential be maintained at the initial value throughout one frame. The actual situation is that this requirement is not always satisfied because of numerous defects.

Where the liquid-crystalline material is a ferro-electric liquid crystal, it is necessary to set the injection current to a large value. For this purpose, the current margin of the TFT must be made large by increasing the dimensions of it.

SUMMARY OF THE INVENTION

It is an object of the present invention to provide a liquid-crystal electro-optical device free of the foregoing problems arising from asymmetrical states assumed by elements driving the pixels when the elements are turned on and off, i.e., the potentials applied to the display portions do not sufficiently settle in state 0 or 1, and their levels drift during one frame.

It is another object of the invention to provide a liquid-crystal electro-optical device which can compensate for malfunctions, typically caused by a short circuit or leakage between the source and drain.

These objects are achieved by a liquid-crystal electro-optical device comprising: a plurality of pixels arranged in rows and columns on a substrate; plural complementary TFT configurations formed for each pixel electrode, each complementary TFT configuration consisting of at least one p-channel thin-film transistor and at least one n-channel thin-film transistor, the input and output terminals of the TFTs of each complementary TFT configuration being connected in series, one of these input and output terminals being connected to the pixel electrode, the other being connected to a first signal line, all the gate electrodes of the TFTs of the complementary TFT configuration being connected to a second signal line.

In each complementary TFT configuration, one of the input and output terminals of the n-channel TFT and one of the input and output terminals of the p-channel TFT are connected to each other. The gate electrode of the p-channel TFT is connected with the gate electrode of the n-channel TFT. These connected terminals act as the source, drain, and gate electrodes.

The above-described objects are also achieved by a liquid-crystal electro-optical device comprising: a plurality of pixels arranged in rows and columns on a substrate; plural p-channel thin-film transistors (TFTs) and plural n-channel TFTs Provided for each one pixel electrode, the input and output terminals of the source and drain regions of the p-channel TFTs being connected in series, one of these input and output terminals being connected to the pixel electrode, the other being connected to a first signal line, the input and output terminals of the source and drain regions of the n-channel TFTs being connected in series, one of these input and output terminals being connected to the pixel electrode, the other being connected to the first signal line, all the gate electrodes of the TFTs being connected to a second signal line.

Other objects and features of the invention will appear in the course of the description thereof which follows.

BRIEF DESCRIPTION OF THE DRAWINGS

FIG. 4(A) is a plan view of the device shown in FIG. 3;

FIGS. 4(B) and 4(C), are cross-sectional views taken on lines A-A' and B-B', respectively, of FIG. 4(A);

DETAILED DESCRIPTION OF THE INVENTION

Figure 1:
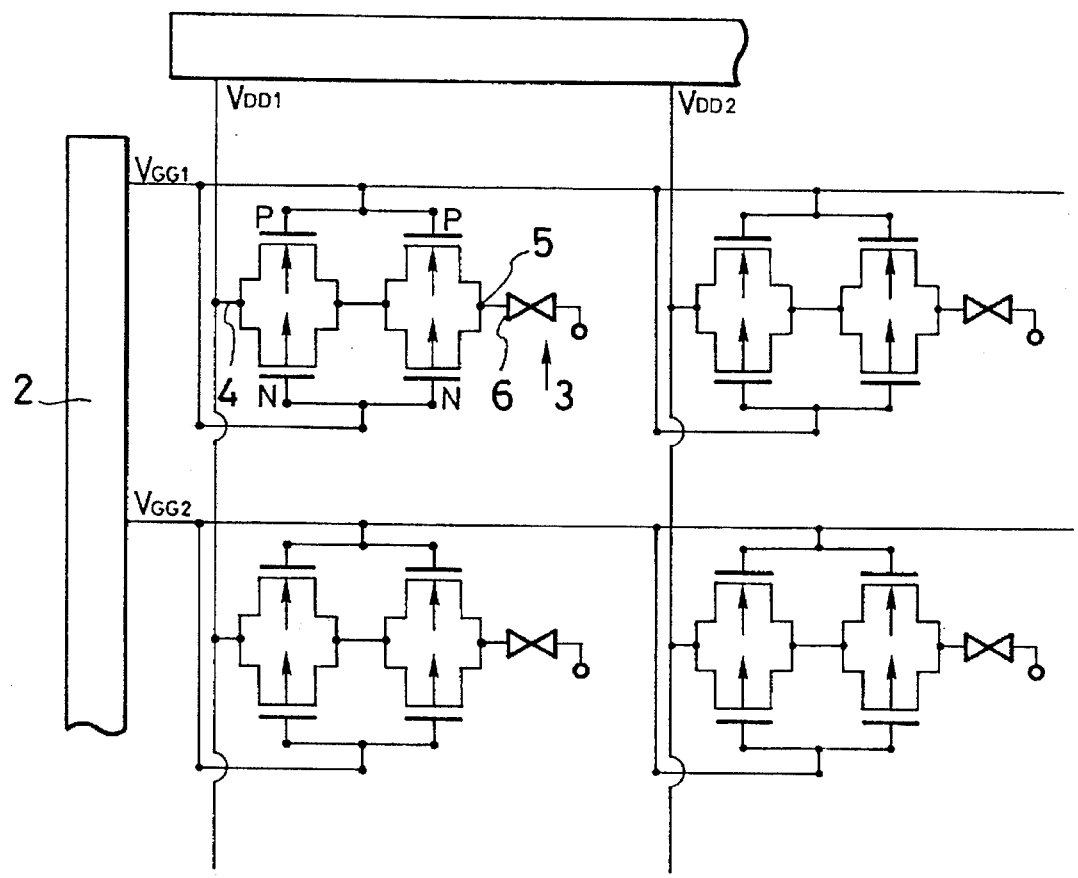
FIG. 1 is a schematic view of a 2×2 matrix liquid-crystal electro-optical device according to the present invention.
Figure 2:
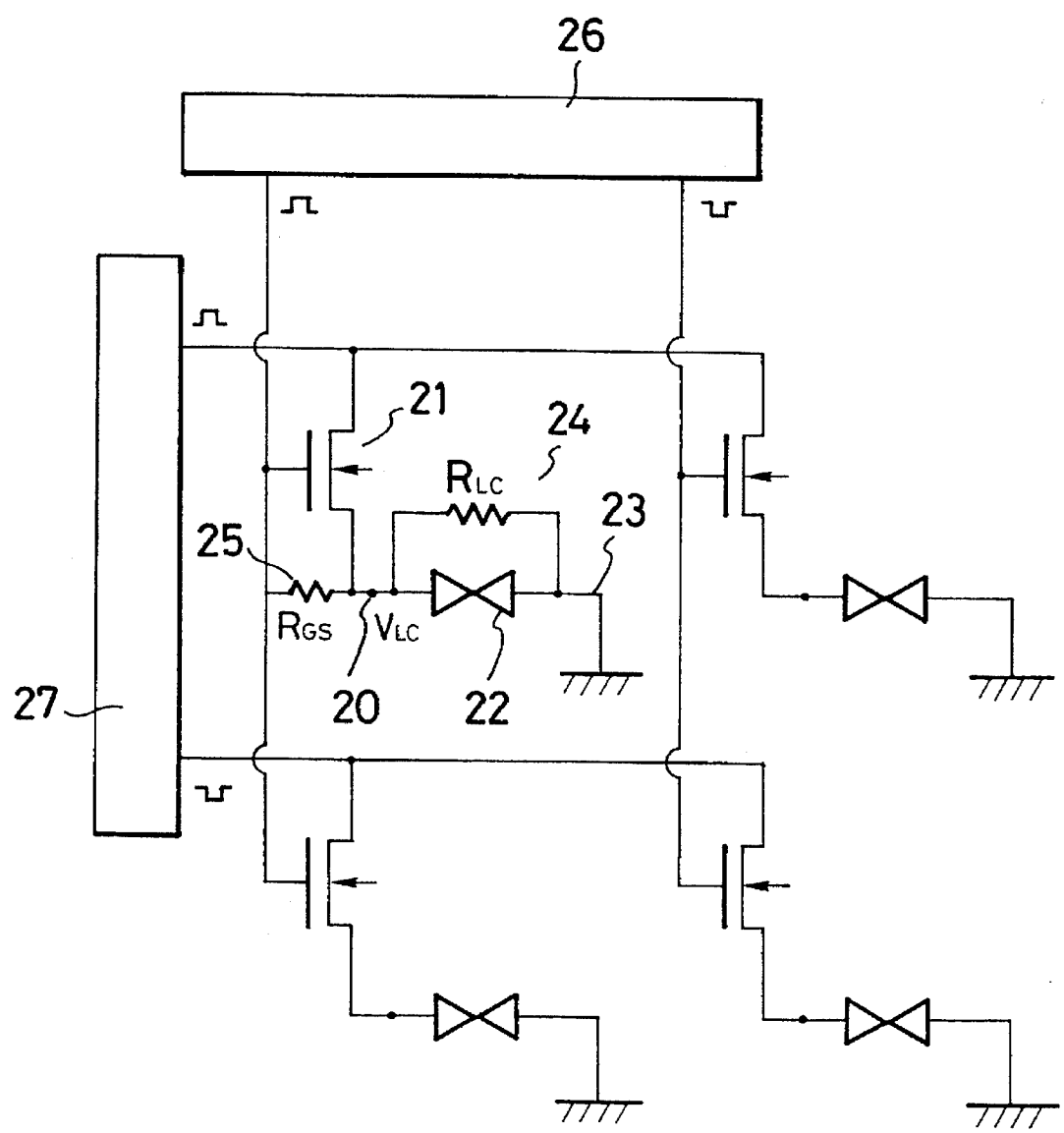
FIG. 2 is a circuit diagram of a conventional liquid-crystal electro-optical device.

Referring to FIG. 1, there is shown a 2×2 active-matrix liquid-crystal electro-optical device according to the invention. This device is driven by peripheral circuits 1 and 2. Two complementary TFT pairs each consisting of a p-channel TFT (thin-film transistor) and an n-channel TFT are connected with one pixel 3. In each complementary TFT pair, the source and drain regions of the p-channel TFT are electrically connected respectively to the corresponding regions of the n-channel TFT. The inputs and outputs of these two complementary TFT pairs are connected in series with the pixel electrode. One input/output 4 is connected with the corresponding signal line VDD1 of signal lines arranged in rows and columns. The other input/output 5 is connected with the pixel electrode 6 of the liquid crystal. The gate electrodes of these four TFTs are connected with a common signal line VGG1. In this way, two complementary TFT pairs are provided for one pixel. Each pixel of the liquid crystal device has this complementary TFT configurations. In this structure, the pixel electrode 6 can sufficiently take the level 0 or 1 when the p- and n-channel TFTs of the complementary TFT pairs are turned on and off so that the level of the potential does not drift during one frame. The two complementary TFT pairs are connected in series. Therefore, if any one of these four TFTs malfunctions, e.g., a short circuit or leakage between the source and the drain, the remaining TFTs compensate for the operation. In particular, these two complementary TFT pairs are connected in series. Consequently, if any one is maintained in conduction, the remaining TFTs can turn on and off the pixel.

Furthermore, because of the series connection of the two pairs, the resistance is doubled compared with the resistance of an ordinary TFT. This reduces a weak leakage current produced in OFF state. Hence, the potential at the pixel 3 sufficiently settles in state 0 or 1.

Figure 3:
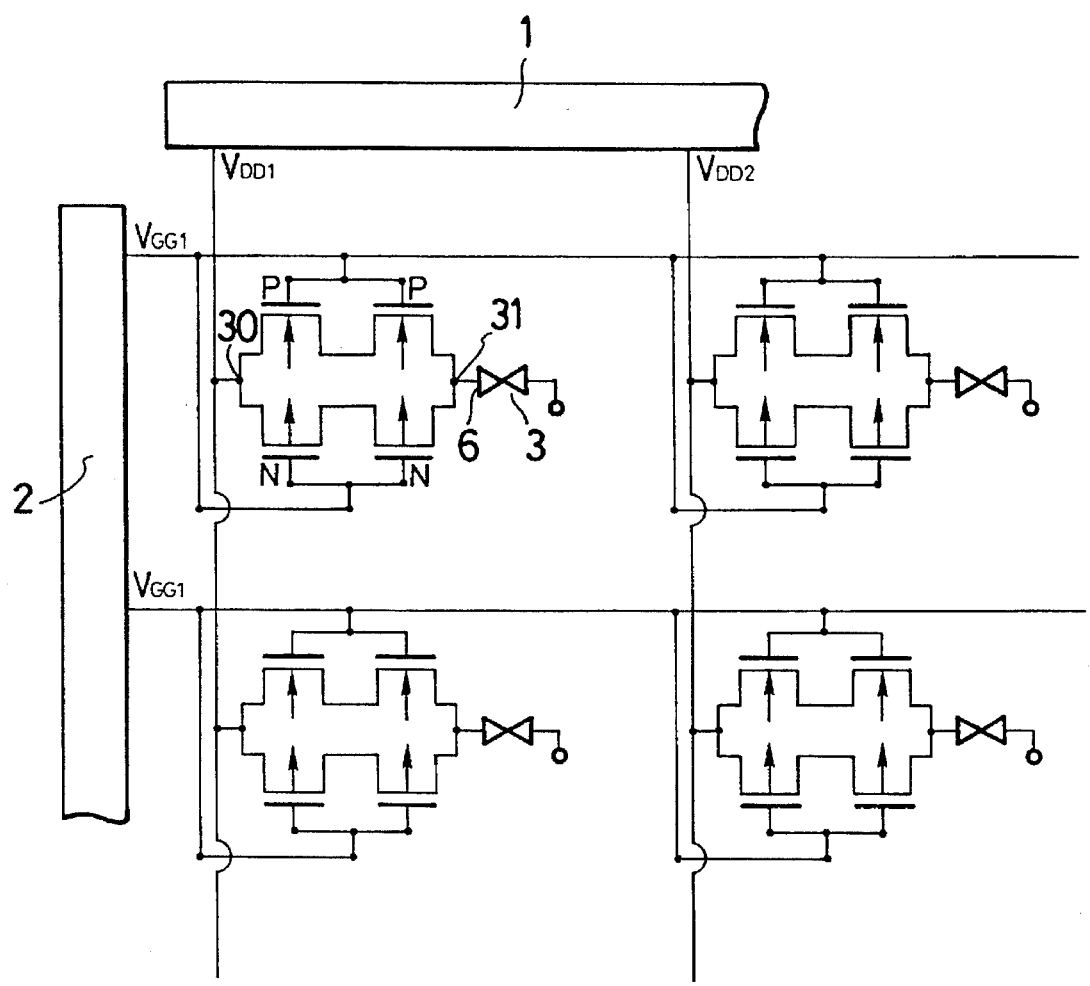
FIG. 3 is a fragmentary circuit diagram of a liquid-crystal electro-optical device according to the invention.

Referring next to FIG. 3, there is shown another 2×2 active-matrix liquid-crystal electro-optical device according to the invention. Two p-channel TFTs and two n-channel TFTs are connected as a complementary TFT configuration with one pixel 3. Specifically, source and drain regions of the two p-channel TFTs of these four TFTs are connected, so that the p-channel TFTs are in series. Also, source and drain regions of the two n-channel TFTs are connected, so that the n-channel TFTs are in series. The other source and drain regions of these p- and n-channel TFTs are electrically connected with each other to form one complementary TFT configuration. The input and output of this complementary TFT configuration are electrically connected in series with the pixel electrode. One input/output 30 is connected with the corresponding signal line VDD1 of signal lines arranged in rows and columns. The other input/output 31 is connected with the pixel electrode 6 of the liquid crystal.

The gate electrodes of these four TFTs are connected with a common signal line VGG1. One complementary TFT configuration consisting of the four TFTs is provided for one pixel.

In this way, in accordance with the present invention, plural complementary TFT pairs are connected in series with one pixel electrode. Alternatively, they function as one complementary TFT configuration as a whole. If any one of the TFTs malfunctions, the operation is compensated for by the remaining TFTs. It is to be noted that the present invention is not limited to the above examples. The novel liquid-crystal electro-optical device can be realized by incorporating more TFTs.

In the embodiment described in conjunction with FIG. 1, exactly the same function can be implemented by interchanging the positions of the p-channel and n-channel TFTs. This gives some degree of freedom to the layout of the liquid-crystal electro-optical device.

EXAMPLE 1

Two p-channel TFTs and two n-channel TFTs were formed per pixel. FIG. 4(A) is a plan view of a substrate on which complementary TFT configurations of this example are formed. FIGS. 4 (B) and 4(C), are cross-sectional views taken on lines A-A' and B-B', respectively, of FIG. 4(A). The TFTs are fabricated as illustrated in FIG. 5(A)-5(E). It is to be noted that the components are not drawn to scale and that particulars are omitted.

The manner in which two p-channel TFTs 41 or two n-channel TFTs 40 are fabricated is now described by referring to FIGS. 5(A)-5(E), which correspond to the cross-sectional view taken on line B-B' of FIG. 4(A), namely to FIG. 4(C). The p-channel TFTs and n-channel TFTs are fabricated by the same process except for the introduced dopant.

First, a glass substrate 50 capable o withstanding thermal treatment at about 600° C., such as AN glass manufactured by Asahi Glass Company, Ltd., Japan, or Pyrex was prepared. The AN glass is equivalent to non-alkali glass. A silicon oxide film 51 acting as a blocking layer was formed on the substrate 50 up to a thickness of 1000 to 3000 A by RF sputtering with a magnetron. The ambient was 100% oxygen. The film was formed at 150° C. The output power was 400 to 800 W. The pressure was 0.5 Pa. The target was made of quartz or a single crystal of silicon. The sputtering rate was 30 to 100 A/min. A silicon film 52 was formed on this film 51 by LPCVD (low-pressure chemical vapor deposition), sputtering, or plasma-assisted CVD. Then, the laminate was patterned by a known photolithographic patterning process. In this way, a shape as shown in FIG. 6(A) was derived.

When this silicon film was being formed by LPCVD, disilane ($Si_2H_6$) or trisilane ($Si_3H_8$) was supplied to the CVD apparatus at a temperature lower than the crystallization temperature by 100° to 200° C. such as 450° to 550° C., e.g., 530° C. The pressure inside the reaction furnace was 30 to 300 Pa. The film was formed at a rate of 50 to 250 A/min. In order that the n-channel and p-channel TFTs have substantially the same threshold voltage Vth, boron taking the form of diborane may be implanted into the film at a dopant concentration of $1×10^{14}$ to $1×10^{17}$ atoms/cm$^3$.

Where this silicon film was formed by sputtering, the inside of the reaction chamber was evacuated to less than $1\times10^{-5}$ Pa before the sputtering. The target was made of a single crystal of silicon. The ambient consisted of argon to which 20–80% hydrogen was added. For example, argon accounted for 20%, while hydrogen accounted for 80%. The film was formed at 150° C. The frequency was 13.56 MHz. The output of the magnetron was 400 to 800 W. The pressure was 0.5 Pa.

When this silicon film was formed by plasma-assisted CVD, the temperature was 300° C., for example. Monosilane ($SiH_4$) or disilane ($Si_2H_6$) was used as a reactive gas. This reactive gas was admitted into the PCVD apparatus, and RF electric power of 13.56 MHz was applied to form the film.

Preferably, the oxygen content of the film formed by these methods is less than $7\times10^{19}$ atoms/$cm^3$, more preferably less than $1\times10^{19}$ atoms/$cm^3$. If the oxygen content is high, it is difficult to crystallize the semiconductor layer. In this case, therefore, it is required to elevate the annealing temperature or to increase the anneal time. By selecting the oxygen content in this way, crystallization can be readily realized at moderate temperatures lower than 600° C. The impurities contained in the film used in the present embodiment were investigated by secondary ion mass spectrometry. The oxygen content was $8\times10^{18}$ atoms/$cm^3$. The carbon content was $3\times10^{16}$ atoms/$cm^3$. The hydrogen content was $4\times10^{20}$ atoms/$cm^3$ which was 1 atomic % of the silicon content of $4\times10^{22}$ atoms/$cm^3$.

Also, it is advantageous to implant oxygen, carbon, or nitrogen ions into only parts of the channel formation regions of the TFTs forming pixels at a dopant concentration of $5\times10^{19}$ to $5\times10^{21}$ ions/$cm^3$ so that the sensitivity to light may drop. In this case, it is possible to reduce the oxygen contents of the TFTs forming peripheral circuits. Thus, the carrier mobility in these TFTs are made larger. This facilitates operation at high frequencies. Additionally, the leakage current from the switching TFTs around the pixels in OFF state can be reduced. The oxygen content of the film formed by these methods is preferably less than $7\times10^{19}$ atoms/$cm^3$, more preferably less than $1\times10^{19}$ atoms/$cm^3$, because the crystallization is promoted under these typical crystallization conditions.

After the amorphous silicon film was deposited to 500 to 3000Å, e.g., 1500Å, in this way, the laminate was heated at a moderate temperature between 450° and 700° C. for 12 to 70 hours within a non-oxidizing ambient. For instance, the temperature was maintained at 600° C. within nitrogen or hydrogen ambient. Since the amorphous silicon oxide film was formed under the silicon film and on the surface of the substrate, no specific nuclei existed during this thermal treatment so that the whole laminate was annealed uniformly. Specifically, during the formation of the film, it had an amorphous structure, and the hydrogen was merely added. The annealing caused the silicon film to shift from the amorphous structure to a highly ordered state. Portions of the silicon film assumed a crystalline state. Especially, those regions which assumed a comparatively ordered state during the formation of the silicon film tended to crystallize. However, intervening silicon atoms between these highly ordered regions couple together these regions and, therefore, these regions attract each other. Measurement by laser Raman spectroscopy has shown that peaks shifted toward lower frequencies from the peak 522 $cm^{-1}$ of a single crystal of silicon existed. Calculation from the half-width values has revealed that the apparent particle diameters ranged from 50 to 500 Å. That is, they resembled micro-crystallites. In practice, however, there existed numerous crystalline regions, i.e., clusters were produced. These clusters were anchored to each other by the silicon atoms. The resulting coating had a semi-amorphous structure. Substantially no grain boundaries existed in this coating. Since carriers can move easily from cluster to cluster through the anchored locations, the carrier mobility is higher than polycrystalline silicon having clear grain boundaries. More specifically, the Hall mobility ($\mu h$) is 10 to 200 $cm^2$/V.sec. The electron mobility ($\mu e$) is 15 to 300 $cm^2$/V.sec.

If the coating is made polycrystalline by an anneal at a high temperature between 900° to 1200° C. rather than by an anneal at a moderate temperature, then the impurities in the coating segregate because of solid-phase growth from nuclei. A large amount of impurities such as oxygen, carbon, and nitrogen is contained in the grain boundaries. The mobility within one crystal is large. However, movement of the carriers is impeded by the barriers formed by the grain boundaries. The result is that it is difficult to obtain a mobility exceeding 10 $cm^2$/V.sec.

Figure 5A:
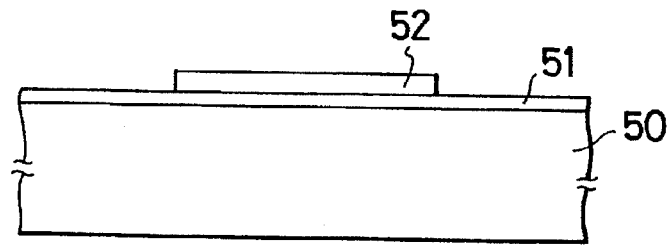
FIGS. 5(A)-5(E), are cross-sectional views illustrating a sequence of steps carried out to fabricate TFTs according to the invention.
Figure 5B:
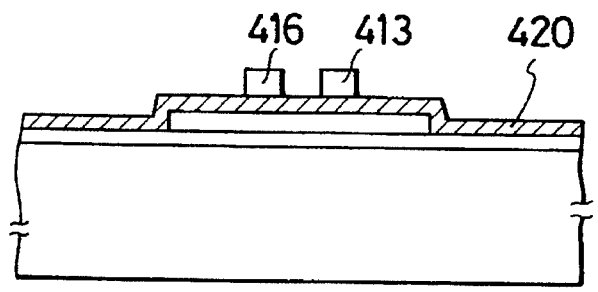

As described above, in the present example, a semi-amorphous or semi-crystalline silicon semiconductor was used. A silicon oxide film was formed on this semiconductor as a gate-insulating film 420 up to a thickness of 500 to 2000 Å, e.g., 1000 Å. This film 420 was formed under the same conditions as the silicon oxide film 51 acting as the blocking layer. During the formation of this film, a small amount of fluorine might be added. Subsequently, a metal coating of aluminum was formed on the film 420. This was patterned into gate electrodes 413 and 416, using a photomask. For example, the channel length was 10 μm, and the thickness was 0.3 μm. As a result, a shape as shown in FIG. 5(B) was derived. Extensions of these gate electrodes also formed electrode interconnects 43 and 44 extending along the Y-axis as shown in the plan view of FIG. 4(A).

The gate electrodes were made of aluminum. Other metals such as molybdenum, chromium, and doped silicon film can also be employed as the material of the gate electrodes. Where the gate electrodes are made of aluminum as in the present example, the surrounding portions are anodized. Using the oxidized film, contact holes in the electrodes in the source and drain regions can be formed so as to be self-aligned. Feeding points can be formed close to the channel regions. This reduces the effects of the resistive components of the source and drain regions.

Figure 5C:
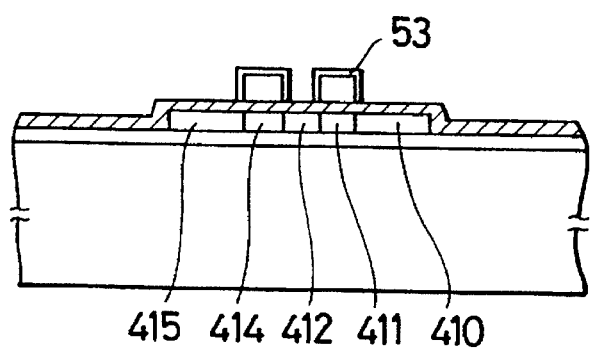

Referring to FIG. 5(C), in order to form p-channel TFTs, a photoresist was formed, using a photomask so that a mask was coated over the n-channel TFT regions. Then, boron was implanted into the source and drain regions 410, 412, and 415 at a concentration of $1\times10^{15}$ ions/$cm^3$, using the gate electrodes as a mask, by self-aligned doping.

Where n-channel TFTs are fabricated, phosphorus ions are implanted at a dopant concentration of $1\times10^{15}$ ions/$cm^3$ to form the source and drain electrodes of the n-channel TFTs. In the present example, the p-channel TFTs 41 and the n-channel TFTs 40 run parallel as shown in FIG. 4(A). Therefore, in order to fabricate individual TFTs, the TFT regions on one side may be masked, using a photoresist.

This ion implantation was effected through the gate-insulating film 420. However, the silicon oxide on the silicon film may be removed, using the gate electrodes 413 and 416 as a mask, and then boron or phosphorus ions may be directly implanted into the silicon.

Thereafter, the laminate was annealed again at 600° C. for 10 to 50 hours. Doped regions 400, 402, 405 of the n-channel TFTs and doped regions 410, 412, 415 (FIG. 5(C)) of the p-channel TFTs were activated to form n+ and p+ regions. Channel formation regions 411 and 401 consisting of a semi-amorphous semiconductor were formed under the gate electrodes 413. Channel formation regions 414 and 404 consisting of a semi-amorphous semiconductor were formed under the gate electrodes 416.

In this way, complementary TFT configurations shown in FIGS. 4(A)–4(C), can be fabricated without requiring any step carried out above 700° C. in spite of the self-aligned doping. Consequently, it is not necessary that the substrate be made of an expensive material such as quartz. This process is quite suited for the fabrication of a liquid-crystal electro-optical device having a very large number of pixels.

The anneal was carried out twice to the structures shown in FIGS. 6(A) and 5(C). However, depending on the demanded characteristics, the anneal in FIG. 5(A) can be omitted. In this case, the time required for the fabrication can be shortened.

Figure 5D:
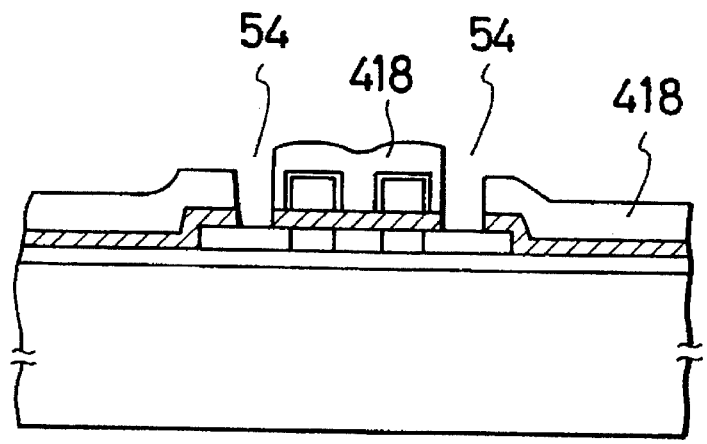

Before or after the annealing step illustrated in FIG. 5(C), the surfaces of the gate electrodes 413 and 416 were anodized to form an insulating film 53 of aluminum oxide. Then, as shown in FIG. 5(D), a silicon oxide film acting as an interlayer insulator 418 was formed on the insulating film 53 by the above-described sputtering process. This silicon oxide film could also be formed by LPCVD or photo-assisted CVD. For example, the thickness of this silicon oxide film is 0.2 to 0.4 m. Subsequently, windows 54 as contact holes were formed, using a photomask. At this time, the contact holes could be formed in a manner in that the ends of the photomask is aligned to the aluminum oxide 53 in order to reduce the distance between the feeding points for the doped regions and their respective channel formation regions.

Figure 5E:
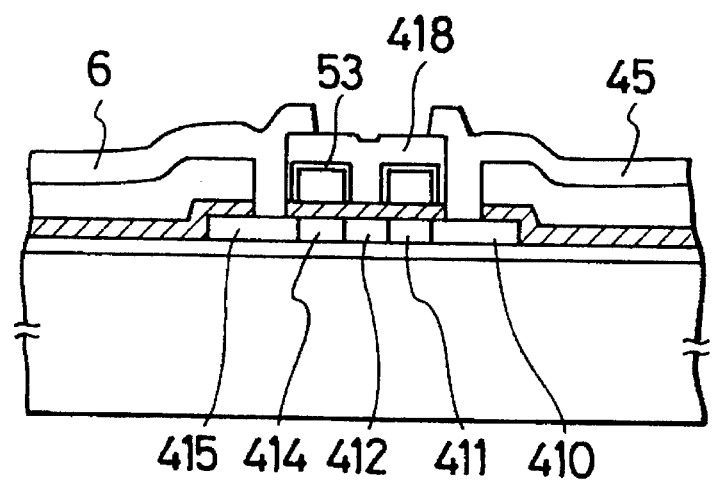

Then, aluminum was sputtered on the whole laminate, and conductive interconnects 45 were fabricated, using a photomask, as shown in FIG. 5(E). Thereafter, as shown in FIG. 4(A), an indium tin oxide (ITO) film was formed by sputtering such that four TFTs formed a complementary TFT configuration and that their output terminals 405 and 415 were connected with transparent electrodes 6 at contacts 31, each transparent electrode 6 serving as one of each pair of pixel electrodes in the liquid-crystal display. This film was etched, using a photomask, to form the pixel electrodes 6. This ITO film was formed at a temperature between room temperature and 150° C. Then, the film was annealed at 200° to 400° C. within oxygen or atmospheric ambient. In this way, two p-channel TFTs 41, two n-channel TFTs 40, and the electrode 6 of the transparent conductive film were formed on the same glass substrate 50. The characteristics of these p-channel TFTs (PTFTs) and n-channel TFTs (NTFTs) are listed in Table 1 below.

TABLE 1

|  | mobility (cm$^2$/V · sec.) | V$_{th}$ (threshold voltage) |
|---|---|---|
| PTFTs | 20 | −3 |
| NTFTs | 30 | +3 |

TFTs having large mobilities could be fabricated by the use of such a semiconductor, which could have generally been considered to be impossible to achieve. Therefore, complementary TFTs acting as the active elements of the liquid-crystal electro-optical device shown in FIGS. 4(A)–4(C), could be first fabricated.

In the present example, the TFTs are of the planar type. The present invention is not limited to this type. The present invention may also be embodied, using other TFT structures.

Referring to FIG. 4(A), conductive interconnects 43 and 44 which included the signal lines VGG1 and VDD2 and extended along the Y-axis were formed. These interconnects are hereinafter referred also as the Y lines. Conductive interconnects 45 and 46 which included the signal lines VDD1 and VDD2 and extended along the X-axis were formed. These interconnects are hereinafter referred to as the X lines. The two n-channel TFTs 40 and the two p-channel TFTs 41 were formed at the intersection of the Y line VDD1 and the X line VGG1 and together formed a complementary TFT configuration. Similar complementary TFT configurations were formed for other pixels as shown. All of these complementary TFT configurations were arranged in rows and columns. In each complementary TFT configuration consisting of a pair of p-channel TFTs and a pair of n-channel TFTs, one drain 405 and one source 415 were connected with the transparent conductive film 6 via the contacts 31, the conductive film 6 being a pixel electrode. The other source 410 and the other drain 400 were connected with the X line 45 by a contact 30, the X line 45 being one of signal lines forming a matrix line structure. All the gate electrodes of the n-channel and p-channel TFTs were connected with the aluminum conductor of the Y line 43 that was one of the signal lines. That is, the two p-channel TFTs were connected in series between the pixel electrode and the X signal line 45. Similarly, the two n-channel TFTs were connected in series between the pixel electrode and the X signal line 45. These four TFTs together formed a complementary TFT configuration.

In this way, one pixel was formed by the complementary TFT configuration consisting of the transparent conductive film 6 together with the four TFTs within the region surrounded by the two X lines and the two Y lines. This structure is repeated horizontally and vertically to form a liquid-crystal electro-optical device having a large number of pixels, such as 640×480 pixels or 1280×960 pixels, which is an enlargement of the 2×2 matrix.

An orientation film was formed on the substrate constructed as shown in FIG. 4, (A)–4(C). This substrate and another substrate having counter pixel electrodes were disposed by a well-known method such that a given distance was maintained between them. A liquid-crystalline material was injected into the gap to complete the liquid-crystal electro-optical device. Where a twisted-nematic liquid crystal is used as the liquid-crystalline material, the distance between the substrates is set to about 10 μm. Also, it is necessary to form a rubbed orientation film on each transparent conductive film.

Where a ferroelectric liquid crystal is employed as the liquid-crystalline material, the operating voltage is ±20 V. The distance between the cells is set to 1.5 to 3.5 μm, e.g., 2.3 μm. An orientation film is formed only on the counter electrode and rubbed.

Where a dispersion or polymeric liquid crystal is used, no orientation film is needed. To make the switching speed fast, the operating voltage is set to ±10 to 15 V. The distance between the substrates holding the liquid crystal therebetween is as small as 1 to 10 μm. Especially, where a dispersion liquid crystal is used, no polarizer sheet is necessary. Therefore, the quantity of light can be made large, irrespective of whether the device is of the reflection type or of the transmittance type. Since this liquid crystal has no threshold voltage, a large contrast can be obtained if the novel complementary TFT configurations characterized by having distinct threshold voltages are used. Also, crosstalk between adjacent pixels can be prevented.

The present invention is characterized in that a plurality of TFTs are arranged so as to form a complementary TFT configuration per pixel and that the pixel electrode 6 is placed at the liquid-crystal potential VLC which settles in one of two levels, depending on whether the p-channel TFTs are ON and the n-channel TFTs are OFF or the p-channel TFTs are OFF and the n-channel TFTs are ON.

Figure 6:
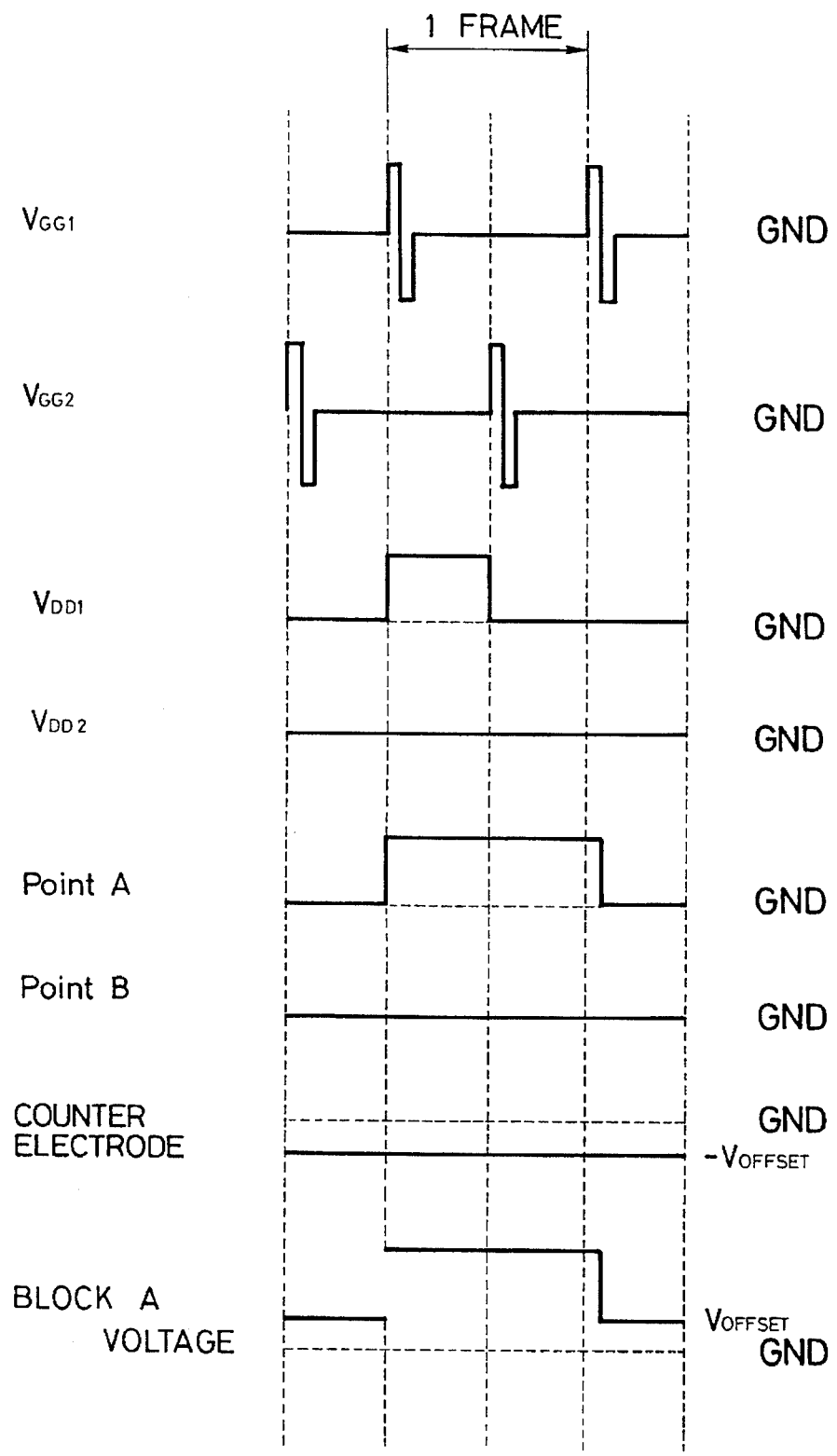
FIG. 6 is a waveform diagram illustrating the waveforms of signals for activating complementary TFT configurations.

The principle of operation of the present example of complementary TFT configuration is now described by referring to FIG. 6. Signal voltages are applied to a pair of signal lines VDD1 and VDD2 and to a pair of signal lines VGG1 and VGG2 shown in FIG. 3 to apply voltages to the pixels, for causing the liquid crystal to exhibit the electrooptical effect. FIG. 6 is a waveform diagram of signal voltages applied to these four signal lines and to the counter electrode on the other substrate, for applying a voltage to the liquid crystal located at a point A corresponding to the pixel lying at the intersection of the signal lines VDD1 and VGG1. As can be seen from FIG. 6, one frame is divided into two, since what is shown in FIG. 3 is a 2×2 matrix. The voltage actually applied across the liquid crystal 3 is referred to as the "block A voltage" in this figure. It is to be noted that only two states, i.e., ON and OFF states, are shown. Where a display is provided at various gray levels, the voltages of the signal waveforms applied to the signal line VDD1 or VDD2 are varied according to the gray levels. As an example, in the case of FIG. 3, if it is desired to make the transmittance of the liquid crystal at the point A large, then the voltage applied to the signal line VDD1 shown in FIG. 6 is increased according to the transmittance of the liquid crystal. Conversely, if the transmittance of the liquid crystal should be made small, then a low signal voltage is applied. That is, the gray-scale display can be provided by adjusting the voltages applied to the signal line VDD1 or VDD2. Point B shown in FIG. 6 represents the potential at the pixel electrode connected with the signal line VDD2. It can be seen that OFF state is maintained irrespective of the voltages applied to the signal lines VGG1 and VGG2, because the voltage applied to the signal line VDD2 is kept in OFF state.

Meanwhile, the signal voltage VGG applied to the signal lines $V_{GG1}$ and $V_{GG2}$ must be larger than the threshold voltage Vth of the complementary TFT configuration, i.e., $V_{GG1} \gg V_{th}$. Applying a negative voltage $V_{OFFSET}$ which is a threshold voltage of the liquid crystal as shown in FIG. 6 to the counter electrode is effective in providing a display at various gray levels, making use of the relation of the voltage applied to the liquid crystal to the transmittance of the liquid crystal.

In the operation described above, if either one of the two p-channel TFTs 41 or one of the two n-channel TFTs 40 malfunctions due to a short circuit or leakage, and if there was only one complementary TFT configuration, then the voltage applied to the signal line $V_{DD1}$ or $V_{DD2}$ is directly applied to the pixel of the liquid crystal and thus either ON state or OFF state is maintained, irrespective of whether the applied voltage is $V_{GG1}$ or $V_{GG2}$. In accordance with the present invention, two p-channel TFTs and two n-channel TFTs are connected in series between the signal line $V_{DD1}$ or $V_{DD2}$ and the pixel electrode. Therefore, even if a short circuit occurs between the source and the drain of any one TFT, the other TFT can control the activation of the pixel. Consequently, the operation of the defective TFT can be compensated for. This contributes to an improvement in the production yield of the liquid-crystal electro-optical device.

At the same time, these four TFT together constitute a complementary TFT configuration which prevents instability of the liquid crystal potential which would have been encountered in the prior art device. In consequence, the liquid crystal potential can be retained at the desired level. As a result, the liquid crystal can exhibit the electrooptical effect stably.

EXAMPLE 2

Figure 7A:
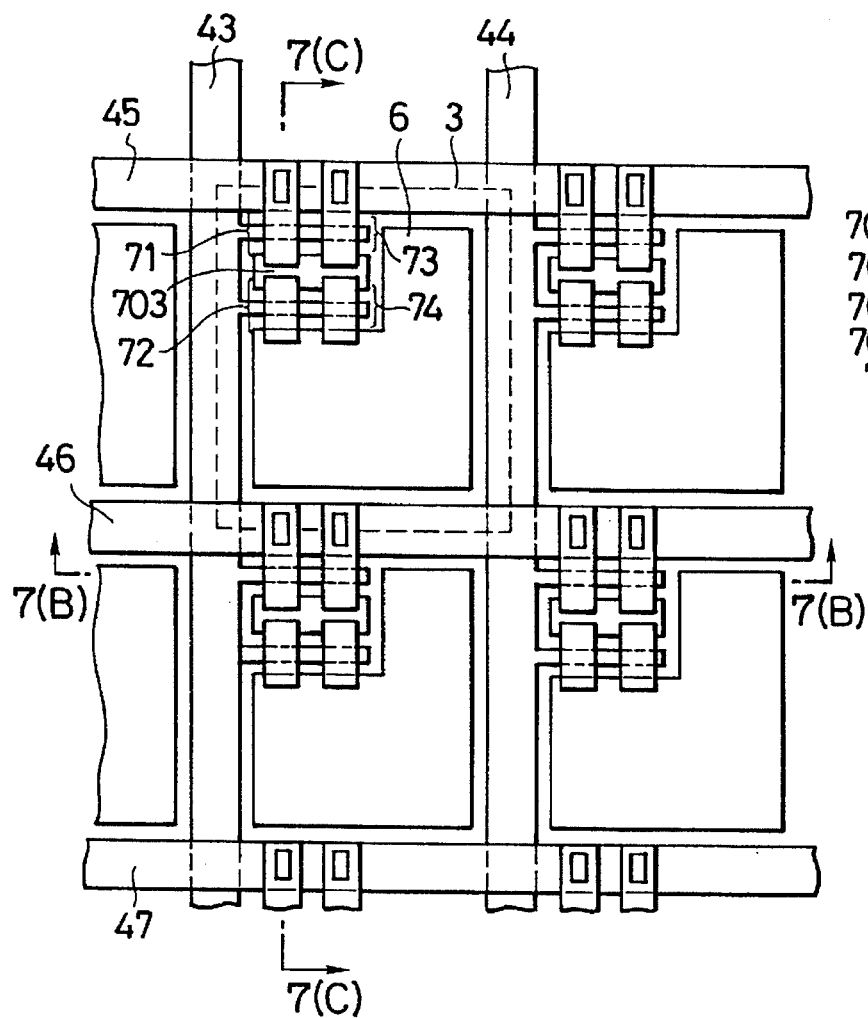
FIG. 7(A) is a plan view of another liquid-crystal electro-optical device according to the invention.
Figure 7C:
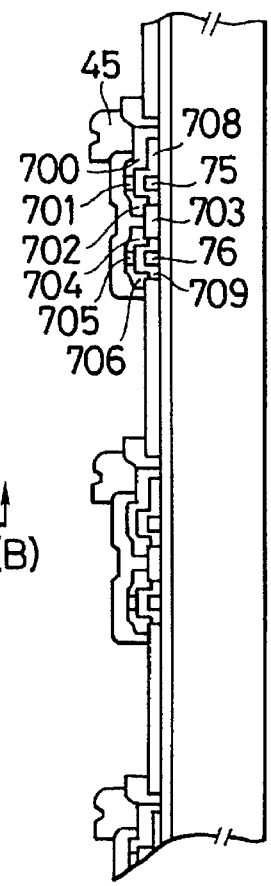
FIGS. 7(B) and 7(C), are cross-sectional views taken on lines A-A' and B-B', respectively, of FIG. 7(A).
Figure 7B:
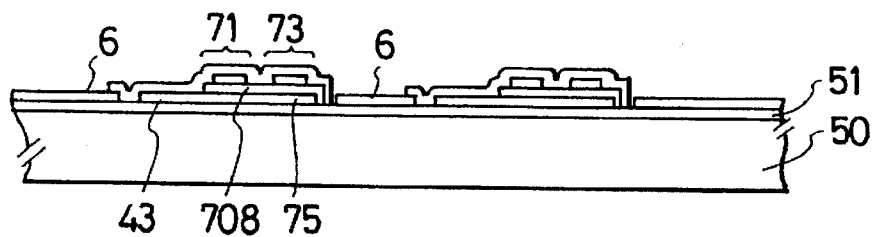

This example is a liquid-crystal electro-optical device constructed as shown in FIGS. 7(A)–7(C). FIG. 7(A) is a plan view of this device. FIG. 7(B) is a cross-sectional view taken on line A–A' of FIG. 7(A). FIG. 7(C) is a cross-sectional view taken on line B–B' of FIG. 7(A).

An equivalent circuit of this example is built as shown in FIG. 1. Four TFTs together form a switching device portion. One p-channel TFT and one n-channel TFT form a complementary TFT pair. Two complementary TFT pairs are connected in series among the signal lines $V_{DD1}$, $V_{DD2}$, and the pixel electrode 6.

In the present example, the first transparent conductive film 6 is formed and then patterned into each pixel electrode 6, while in Example 1, the transparent conductive film 6 acting as the pixel electrodes is formed after the formation of the semiconductor film. Simultaneously with the formation of the pixel electrode 6, an electrode portion 703 connecting one complementary TFT pair with the other complementary TFT pair is formed. Subsequently, a semiconductor portion is formed.

In this example, the structure of the present invention can be obtained without destroying the underlying devices or without breaking the conductive interconnects during the patterning of the transparent conductive film made of, for example, ITO.

In the present example, since all the positions of the two p-channel TFTs 71, 72 and of the two n-channel TFTs 73, 74 are electrically equivalent the TFTs can be disposed at any desired position according to the degree of necessity in the process of manufacturing the TFTs as well as the same advantages can be achieved as obtained in Example 1.

P-channel TFTs 71 and 72 are formed as inverse staggered type TFTs. These TFTs 71 and 72 have gate electrodes 75 and 76, respectively. The TFT 71 further includes a source region 700 and a drain region 702 which are formed on a gate-insulating film 708. Similarly, the TFT 72 further includes a source region 704 and a drain region 706 which are formed on a gate-insulating film 709.

A silicon semiconductor layer formed by PCVD and having been annealed to increase the crystallinity was used as the semiconductor layer of the present example. In the illustrated example, the n-channel TFTs are disposed in a side-by-side relation to the p-channel TFTs, however, the present invention is not limited to this positional relation. Rather, the p-channel TFTs and the n-channel TFTs can be arranged in any desired positional relationship. The manufacturing process is similar to the process of Example 1 in other respects and so these similar steeps are not described.

In the present invention, complementary TFT pairs are connected in series because the invention assumes that some TFTs malfunction due to a short circuit or a leakage between the source and the drain. If any TFT malfunctions due to destruction of the gate-insulating film, it is necessary to electrically disconnect the gate electrode of the defective TFT from the signal line to ensure the operation of the liquid-crystal electro-optical device. If the complementary TFT pairs are connected in series, and if the gate electrode is disconnected, then all the, TFTs operating on that gate electrode cannot operate, with undesirable result. In this case, a plurality of complementary TFT configurations are connected in parallel. Thus, if any TFT malfunctions, then it is easy to electrically disconnect the gate electrode of the defective TFT. However, it is necessary that the source and drain regions be connected with separate power lines.

Hence, the layout pattern is required to be devised, taking account of this fact.

The structure described above permits fabrication of a display unit in which the potential at the pixel 3 sufficiently settles in state 0 or 1 when the complementary TFT configuration consisting of p-channel and n-channel TFTs is turned on and off, and in which the level of the potential does not drift during one frame.

Also, in accordance with the present invention, such complementary TFT configurations are connected in series. If any one of the four TFTs malfunctions due to a short circuit or leakage between the source and the drain, then the operation of the defective TFT is compensated for by the remaining TFTs. Specifically, these complementary TFT configurations are connected in series with the pixel and, therefore, even if any one TFT is maintained in conduction, then the activation of the pixel can be controlled by the remaining TFTs.

Furthermore, the series connection doubles the resistance compared with the conventional structure. This reduces the weak leakage current in OFF state, thus assuring that the potential at the pixel 3 settles in state 0 or 1.

The present invention is not limited to the above disclosed examples but limited only by the appended claims. Many modifications can be done without departing the concept of the invention. For example, it is possible to increase the number of the complementary transistor pairs for each pixel.

Also, in the present example, a device using a liquid crystal is employed as one example of liquid-crystal electro-optical device. The present invention is also applicable to any other device as long as a voltage is applied to the pixel electrodes and a display is provided electrooptically or light is modulated. Examples include a plasma display and an electroluminescent display.

Further, in the present example, semi-amorphous or semi-crystalline semiconductor materials are used. Obviously, semiconductors having other crystalline structures may be used as long as they fulfill the same function.

What is claimed is:

1. A semiconductor device comprising:
    a semiconductor island formed on an insulating surface;
    a first thin film transistor formed with said semiconductor island, said first thin film transistor comprising a first channel region formed in said semiconductor island, a pair of first impurity regions formed in said semiconductor island with said first channel region interposed therebetween, first offset regions between said first channel region and said first impurity regions, and a first gate electrode formed over said first channel region; and
    a second thin film transistor formed with said semiconductor island and electrically connected to said first thin film transistor, said second thin film transistor comprising a second channel region formed in said semiconductor island, a pair of second impurity regions formed in said semiconductor island with said second channel region interposed therebetween, second offset regions between said second channel region and said second impurity regions, and a second gate electrode formed over said second channel region, said second gate electrode being connected to said first gate electrode;
    wherein one of said first impurity region of said first transistor and adjacent one of said second impurity regions have a same conductivity type and are electrically connected with one another, and
    wherein each gate electrode of said first and second thin film transistors comprises a metal and has a surface thereof covered with an oxide layer which is formed by oxidizing a surface of said gate electrode.

2. The device of claim 1 wherein said metal of the gate electrode is selected from the group consisting of aluminum, molybdenum and chromium.

3. A semiconductor device comprising:
    a semiconductor island formed on an insulating surface;
    a first thin film transistor formed with said semiconductor island, said first thin film transistor comprising a first channel region formed in said semiconductor island, a pair of first impurity regions formed in said semiconductor island with said first channel region interposed therebetween, first offset regions between said first channel region and said first impurity regions, and a first gate electrode formed over said first channel region, said first gate electrode comprising a metal and covered with an oxide layer of said first gate electrode;
    a second thin film transistor formed with said semiconductor island and electrically connected to said first thin film transistor, said second thin film transistor comprising a second channel region formed in said semiconductor island, a pair of second impurity regions formed in said semiconductor island with said second channel region interposed therebetween, second offset regions between said second channel region and said second impurity regions, and a second gate electrode formed over said second channel region, said second gate electrode comprising a metal and covered with an oxide layer of said second gate electrode, wherein one of said second impurity regions has a same conductivity type as and is electrically connected to an adjacent one of said first impurity regions of the first transistor;
    an interlayer insulator formed on said first and second thin film transistors; and
    a wiring formed on said interlayer insulator,
    wherein said wiring is electrically connected to another one of said first impurity regions of said first thin film transistor through a contact hole formed in said interlayer insulator, and
    wherein any one of said impurity regions located between the channel regions is not connected to any electrode or lead.

4. The device of claim 3 wherein said metal of each of said first and second gate electrodes is selected from the group consisting of aluminum, molybdenum and chromium.

5. The device of claim 3 wherein said wiring is electrically isolated from said adjacent one of said first impurity regions.

6. A semiconductor device comprising:
    a semiconductor island formed over a substrate;
    a plurality of gate electrodes adjacent to said island, said gate electrodes being electrically connected with one another;
    a gate insulating layer interposed between said gate electrodes and said semiconductor island;
    a plurality of channel regions formed in said semiconductor island adjacent to said gate electrodes;
    a plurality of impurity regions formed in said semiconductor island and contiguous to said channel regions, said impurity regions having a same impurity conductivity type with one another and
    offset regions formed between said channel regions and said impurity regions,
    wherein said gate electrodes comprise an oxidizable material and are provided with an oxide layer of said material on a surface thereof.

7. The semiconductor device of claim 6 wherein said anodizable material of said gate electrodes is selected from the group consisting of aluminum, molybdenum and chromium.

8. A semiconductor device comprising:

a semiconductor island formed over a substrate;

a plurality of gate electrodes formed over said island, said gate electrodes being electrically connected with one another;

a gate insulating layer interposed between said gate electrodes and said semiconductor island;

a plurality of channel regions formed in said semiconductor island below said gate electrodes; and a plurality of impurity regions formed in said semiconductor island and contiguous to said channel regions, said impurity regions having a same impurity conductivity type with one another, an interlayer insulator formed on said semiconductor island;

a wiring formed on said interlayer insulator and electrically connected to one of grid impurity regions, wherein said gate electrode comprises an oxidizable material and is provided with an oxide layer of said material on a surface thereof, and wherein said impurity regions are formed in a self-aligned manner with respect to said gate electrodes having said oxide layer thereon.

9. The semiconductor device of claim 8 wherein said anodizable material of said gate electrodes is selected from the group consisting of aluminum, molybdenum and chromium.

10. A device as in claim 1, 3, 6 or 8 wherein said electrically connected first and second impurity regions at least partially overlap.

11. A device as in claims 1, 3, 6 or 8 wherein said electrically connected first and second impurity regions are contiguous with one another.

12. A semiconductor device comprising:

a semiconductor island formed on an insulating surface;

a plurality of channel legions formed in said semiconductor island, pairs of impurity regions formed in said semiconductor island with said plurality of channel regions respectively interposed therebetween, and a plurality of gate electrodes respectively formed over said channel regions, said gate electrodes each comprising a metal and being covered with an oxide layer of the associated gate electrode and being connected to each other;

wherein on impurity region of each said pair of impurity regions has a same conductivity type as and is electrically connected to one of the impurity regions of an adjacent pair of impurity regions, and wherein said pairs of impurity regions are formed in a self-alignment manner with respect to said gate electrodes having said oxide layer formed thereon.

13. The device of claim 12 wherein said electrically connected impurity regions are contiguous with one another.

14. The device of claim 12 wherein said electrically connected impurity regions at least partially overlap.

15. A semiconductor device comprising:

a semiconductor island formed on an insulating surface;

a plurality of channel regions formed in said semiconductor island, pairs of impurity regions formed in said semiconductor island with said plurality of channel regions respectively interposed therebetween, an offset region interposed between said channel regions and said impurity regions and a plurality of gate electrodes respectively adjacent said channel regions, said gate electrodes each comprising a metal and being covered with an oxide layer of the associated gate electrode and being connected with each other;

wherein one impurity region of each said pair of impurity regions has a same conductivity type as and is electrically connected to one of the impurity regions of an adjacent pair of impurity regions.

16. The device of claim 15 wherein said electrically connected impurity regions are contiguous with one another.

17. The device of claim 15 wherein said electrically connected impurity regions at least partially overlap.

18. The device of claim 15 including a plurality of gate insulating layers respectively interposed between said gate electrodes and said channel regions.

* * * * *